(12) United States Patent
Topping et al.

(10) Patent No.: US 11,086,233 B2
(45) Date of Patent: Aug. 10, 2021

(54) PROTECTIVE COATING FOR ELECTROSTATIC CHUCKS

(71) Applicant: Lam Research Corporation, Fremont, CA (US)

(72) Inventors: Stephen Topping, Portland, OR (US); Vincent Burkhart, Cupertino, CA (US)

(73) Assignee: Lam Research Corporation, Fremont, CA (US)

(*) Notice: Subject to any disclaimer, the term of this patent is extended or adjusted under 35 U.S.C. 154(b) by 432 days.

(21) Appl. No.: 15/926,349

(22) Filed: Mar. 20, 2018

(65) Prior Publication Data

US 2019/0294050 A1 Sep. 26, 2019

(51) Int. Cl.
*G03F 7/00* (2006.01)
*G03F 7/20* (2006.01)
*H01L 21/683* (2006.01)

(52) U.S. Cl.
CPC .......... *G03F 7/707* (2013.01); *H01L 21/6833* (2013.01)

(58) Field of Classification Search
CPC .............................. G03F 7/707; H01L 21/6833
See application file for complete search history.

(56) References Cited

U.S. PATENT DOCUMENTS

| | | | | | |
|---|---|---|---|---|---|
| 5,463,526 | A | * | 10/1995 | Mundt | C23C 28/00 361/230 |
| 5,507,874 | A | * | 4/1996 | Su | B08B 7/0035 134/1 |
| 5,633,073 | A | * | 5/1997 | Cheung | C23C 16/45565 156/293 |
| 5,737,178 | A | * | 4/1998 | Herchen | H01L 21/6831 118/401 |
| 5,812,362 | A | * | 9/1998 | Ravi | H01L 21/6831 279/128 |
| 5,841,624 | A | * | 11/1998 | Xu | H01L 21/6833 361/234 |
| 5,942,282 | A | * | 8/1999 | Tada | C23C 16/0281 427/250 |
| 6,261,977 | B1 | * | 7/2001 | Tsai | H01L 21/67069 438/798 |
| 6,879,051 | B1 | * | 4/2005 | Singh | C23C 16/045 257/301 |
| 9,850,573 | B1 | * | 12/2017 | Sun | C23C 16/40 |
| 2003/0180459 | A1 | * | 9/2003 | Redeker | H01L 21/6831 427/248.1 |

(Continued)

FOREIGN PATENT DOCUMENTS

KR 10-1465640 11/2014

OTHER PUBLICATIONS

International Search Report dated Mar. 13, 2019 from International Application No. PCT/US2019/022046.

(Continued)

*Primary Examiner* — Yusef A Ahmed
(74) *Attorney, Agent, or Firm* — Beyer Law Group LLP

(57) ABSTRACT

An ElectroStatic Chuck (ESC) including a chucking surface having at least a portion covered with a coating of silicon oxide ($SiO_2$), silicon nitride ($Si_3N_4$) or a combination of both. The coating can be applied in situ a processing chamber of a substrate processing tool and periodically removed and re-applied in situ to create fresh coating.

21 Claims, 6 Drawing Sheets

(56) References Cited

U.S. PATENT DOCUMENTS

| | | | | |
|---|---|---|---|---|
| 2004/0074869 | A1* | 4/2004 | Wang | H01L 21/31138 216/63 |
| 2004/0137169 | A1* | 7/2004 | Carollo | C23C 16/455 427/579 |
| 2005/0183669 | A1* | 8/2005 | Parkhe | C23C 16/463 118/724 |
| 2005/0191827 | A1* | 9/2005 | Collins | H01J 37/32082 438/513 |
| 2006/0081558 | A1* | 4/2006 | Collins | H01J 37/32082 216/67 |
| 2006/0158821 | A1* | 7/2006 | Miyashita | H01L 21/683 361/233 |
| 2008/0009417 | A1* | 1/2008 | Lou | C03C 3/095 505/100 |
| 2008/0029032 | A1* | 2/2008 | Sun | H02N 13/00 118/728 |
| 2009/0284894 | A1* | 11/2009 | Cooke | H01L 21/6875 361/234 |
| 2010/0039747 | A1* | 2/2010 | Sansoni | H01L 21/6831 361/234 |
| 2010/0104852 | A1* | 4/2010 | Fletcher | B82Y 40/00 428/315.5 |
| 2010/0323124 | A1* | 12/2010 | Vartabedian | C23C 28/042 427/569 |
| 2012/0044609 | A1* | 2/2012 | Cooke | H01L 21/6831 361/234 |
| 2013/0070384 | A1* | 3/2013 | Cooke | H01L 21/6833 361/234 |
| 2013/0155569 | A1* | 6/2013 | Suuronen | H01L 21/6833 361/234 |
| 2014/0118880 | A1* | 5/2014 | He | H01L 21/6833 361/236 |
| 2014/0203526 | A1* | 7/2014 | Banda | B28D 5/0082 279/128 |
| 2014/0355169 | A1* | 12/2014 | Maeta | H01L 21/6831 361/234 |
| 2014/0356538 | A1* | 12/2014 | Schmitt | G03G 15/2025 427/259 |
| 2015/0241783 | A1* | 8/2015 | Carcasi | G03F 7/091 430/324 |
| 2015/0311043 | A1* | 10/2015 | Sun | H01J 37/32458 428/335 |
| 2015/0311108 | A1* | 10/2015 | Horiuchi | H01L 21/68757 269/302 |
| 2016/0064264 | A1* | 3/2016 | Kulshreshtha | H01L 21/6833 438/787 |
| 2016/0090650 | A1* | 3/2016 | Qian | C23C 16/4404 427/9 |
| 2016/0111315 | A1* | 4/2016 | Parkhe | H01L 21/6833 361/234 |
| 2016/0196984 | A1* | 7/2016 | Lili | H01J 37/32009 438/694 |
| 2016/0281230 | A1* | 9/2016 | Varadarajan | C23C 16/4581 |
| 2016/0336210 | A1* | 11/2016 | Cooke | H01L 21/6833 |
| 2017/0140970 | A1* | 5/2017 | Boyd, Jr. | H01L 21/6875 |
| 2017/0256431 | A1* | 9/2017 | Parkhe | H01L 21/6875 |
| 2018/0061684 | A1* | 3/2018 | Parkhe | H01L 21/67115 |
| 2018/0096869 | A1* | 4/2018 | Yoshida | H01L 21/67103 |
| 2018/0112311 | A1* | 4/2018 | Fenwick | C23C 16/45525 |
| 2018/0308738 | A1* | 10/2018 | Tobe | H01J 37/32715 |
| 2018/0318890 | A1* | 11/2018 | Yasseri | B08B 3/12 |
| 2019/0019713 | A1* | 1/2019 | Hidaka | C04B 35/117 |
| 2019/0115241 | A1* | 4/2019 | Vellore | H01L 21/6831 |
| 2019/0136373 | A1* | 5/2019 | Yeh | H01J 37/32862 |
| 2019/0157052 | A1* | 5/2019 | Doan | H01J 37/32862 |
| 2019/0218663 | A1* | 7/2019 | Funakubo | H01J 37/32862 |
| 2019/0221406 | A1* | 7/2019 | Funakubo | H01L 21/3065 |
| 2019/0237341 | A1* | 8/2019 | Yu | H01L 21/31116 |
| 2019/0267268 | A1* | 8/2019 | Abel | H01L 21/02164 |
| 2019/0276366 | A1* | 9/2019 | Sun | C04B 41/009 |
| 2019/0341289 | A1* | 11/2019 | Parkhe | H01L 21/68785 |
| 2020/0013590 | A1* | 1/2020 | Liu | H01L 21/68757 |

OTHER PUBLICATIONS

Written Opinion dated Mar. 13, 2019 from International Application No. PCT/US2019/022046.

* cited by examiner

PROTECTIVE COATING FOR ELECTROSTATIC CHUCKS

BACKGROUND

ElectroStatic Chucks (ESCs) are widely used in a variety of fabrication tools, such as thin film deposition, plasma etch, photo-resist striping, substrate cleaning as well as lithography, ion implantation, etc.

ESCs operate by applying a charge of one polarity onto a chucking surface and a charge of the opposite polarity on a substrate. Since opposite charges attract, the substrate is held or clamped in place by the resulting electrostatic force.

Coulombic and Johnsen-Rahbek ("J-R") are two types of ESCs that are commonly known. Both have a chucking surface that includes a dielectric formed over an electrode. With Coulombic ESCs, the dielectric is an insulator, whereas with J-R type chucks, the dielectric has a finite resistance (e.g., a bulk resistivity at room temperature ranging from $5.0^{e+15}$ to $5.0^{e+16}$ ohm-cm and at 550 degrees C. a bulk resistivity of $5.0^{e+8}$ to $5.0^{e+9}$ ohm-cm).

SUMMARY

An ElectroStatic Chuck (ESC) is disclosed. The ESC includes a pedestal having a chucking surface arranged to chuck a substrate. The chucking surface includes at least a portion covered with a coating of either silicon oxide ($SiO_2$), silicon nitride ($Si_3N_4$), or a combination of both.

Also disclosed is a method of depositing a coating onto a chucking surface of an ESC within a processing chamber of a substrate processing tool. In non-exclusive variations of this method, the deposited coating is either silicon oxide or silicon nitride, or a combination of both.

Further disclosed is a method for (a) using a halogen-based cleaning agent to remove a first coating formed on a chucking surface of an ESC pedestal and (b) depositing a second coating formed on the chucking surface of the ESC pedestal. By removing the first coating and replacing it with a second coating, the worn first coating can be refreshed with a fresh second coating. In non-exclusive variations of this method, the deposited coating is either silicon oxide or silicon nitride, or a combination of both.

In yet another embodiment, the aforementioned cleaning and coating may be performed in situ the processing chamber. For instance, during routine maintenance, a halogen-based cleaning agent may be used to remove unwanted deposits and particles that have collected on surfaces inside the processing chamber as a byproduct of substrate processing. Following the cleaning, a coating of silicon oxide and/or silicon nitride is then typically applied to the clean surfaces in a subsequent plasma deposition step. Since the cleaning and recoating sequence for the chucking surface of the ESC and the processing chamber are essentially the same, the chucking surface can be cleaned and recoated in situ the processing chamber at the same time as the processing chamber.

The use of silicon oxide and silicon nitride formed on the chucking surface of an ESC has a number of advantages. The coating can be used to protect the chucking surface from degradation and wear due to the shear lateral forces caused by different rates of thermal expansion between substrates and the chucking surface. The coating of silicon oxide and silicon nitride can be readily deposited and removed on the chucking surface in situ a processing chamber. As a result, an old worn coating can be removed and replaced with a new coating as needed or at fixed intervals, all inside the processing chamber.

In yet other non-exclusive embodiments, the coating applied to an ESC chuck can be either silicon oxide, silicon nitride, a combination of both silicon oxide and silicon nitride, or a multi-layer structure including one or more layers each of silicon oxide and silicon nitride.

BRIEF DESCRIPTION OF THE DRAWINGS

The present application and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not necessarily to scale.

DETAILED DESCRIPTION

The present application will now be described in detail with reference to a few non-exclusive embodiments thereof as illustrated in the accompanying drawings. In the following description, numerous specific details are set forth in order to provide a thorough understanding of the present disclosure. It will be apparent, however, to one skilled in the art, that the present discloser may be practiced without some or all of these specific details. In other instances, well known process steps and/or structures have not been described in detail in order to not unnecessarily obscure the present disclosure.

ESCs, regardless of type, have several limitations. Fluorine is often used during the deposition of substrates, such as semiconductor wafers. The exposure of the clamping surface of an ESC to fluorine can introduce charge traps in the dielectric, negatively affecting its electrical properties, reducing the ability to clamp with sufficient force. Also, residual carbon, a by-product of many CVD processes, can also form on the clamping surface. Since carbon is an insulator, its presence on the clamping surface may interfere with the J-R type ESCs, also diminishing clamping strength.

It is known to use a Protective Electrostatic Cover (PEC) over the clamping surface of an ESC to prevent exposure to fluorine and/or residual carbon. The use of a PEC, however, creates a number of complications. A storage location within or adjacent the processing chamber is needed when the PEC is not in use. In addition, a mechanism is needed to move and position the PEC between its storage location and the ESC substrate. Such mechanisms tend to generate unwanted particles, require periodic maintenance, and often break. In addition, control software is needed to control the operation of the mechanism. Such control software tends to add complexity to the tool and increase development costs.

Figure 1:
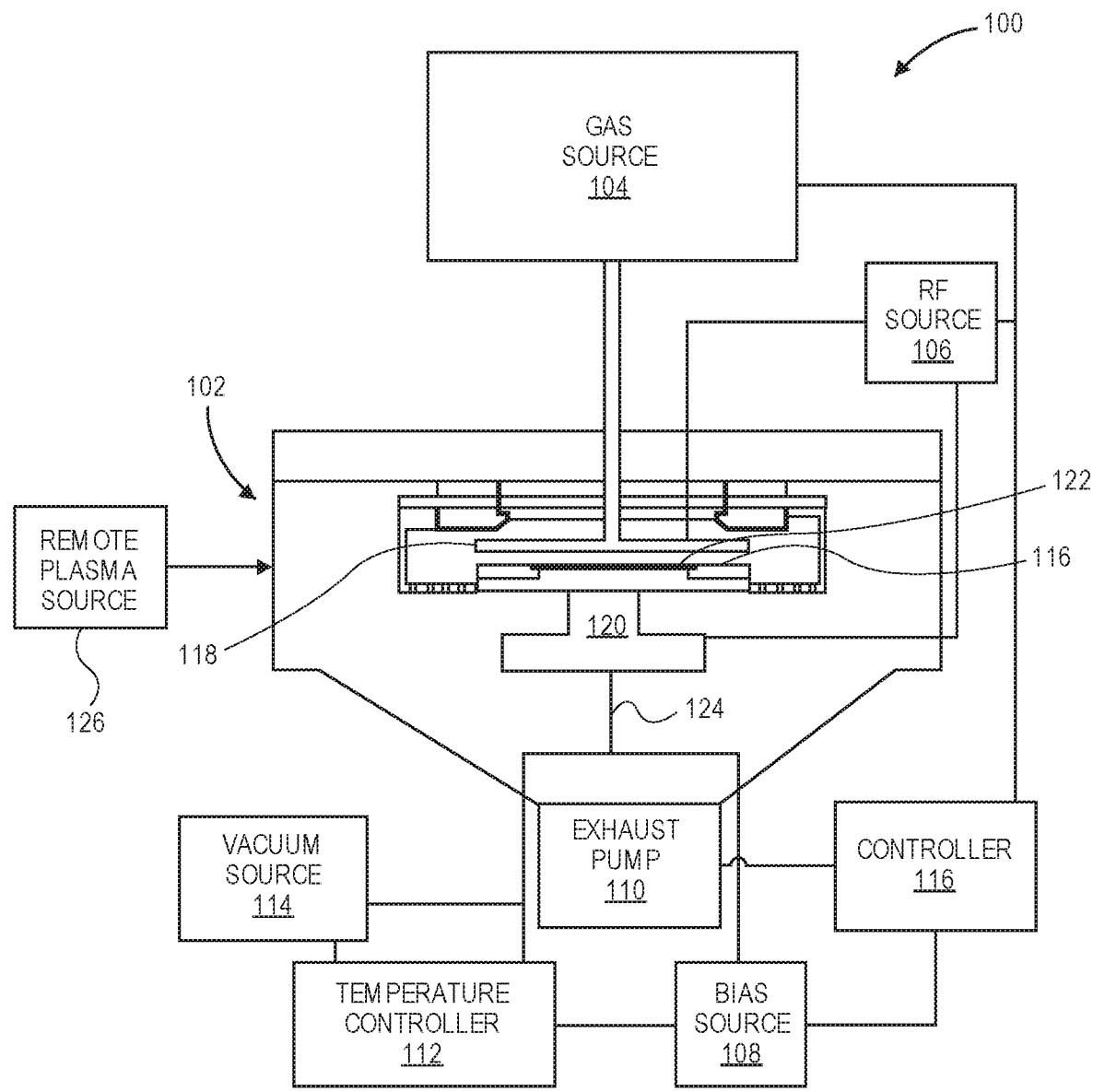
FIG. 1 is a block diagram of a substrate fabrication tool for processing a substrate in accordance with a non-exclusive embodiment.

FIG. 1 is a block diagram of a substrate processing tool 100 that may be used in a non-exclusive embodiment. The substrate processing tool 100, in this example, includes a processing chamber 102, a gas source 104, a Radio Frequency (RF) source 106, a bias source 108, an exhaust pump 110, a temperature controller 112, vacuum source 114 and a controller 116. The processing chamber 102 includes an electrode 118, coupled to the RF source 106, and an ElectroStatic Chuck (ESC) pedestal 120 for chucking a substrate 122.

During operation of the tool 100, a substrate 122 is chucked onto the ESC pedestal 120 within the processing chamber 102 containing a gas supplied by gas source 104. When RF power from RF source 106 is applied to electrode 118, a plasma for processing the substrate 122 within the processing chamber 102 is created. Depending on the type of tool, the plasma may be used to process the substrate 122 in a number of ways, including thin film deposition, etching, etc.

Although not illustrated, it should be noted that in alternative embodiments, the RF source 106 can be alternatively coupled to the pedestal 120. With this alternative embodiment, the pedestal 120 also acts as the electrode for generating the plasma within the processing chamber 102.

Also during operation, the controller 116 may selectively control a number of operations within the processing chamber 102, such as the bias applied to the substrate 122 via the bias source 108, the exhausting of the plasma or other gases out of the processing chamber 102 via the exhaust pump 110, the temperature of the pedestal 120 and/or the substrate 122 via the temperature controller 112 and the vacuum source 114. As each of these elements and their operation are well known, a detailed explanation is not provided herein for the sake of brevity.

In FIG. 1, the various electrical and/or tubing are provided between the various components 108 through 116 and processing chamber 102 and/or the pedestal 120. It should be noted that, for the sake of not over-complicating the details of the drawing, the various electrical and/or tubing connections as illustrated is simplified as a single connection 124. It is well understood that routing of the various electrical and tubing in and out of the processing chamber 102 and/or to the pedestal 120 is very complex, but is not addressed herein for the sake of brevity.

In one non-exclusive embodiment, tool 100 may include or operate in cooperation with a remote plasma source 126. A plasma generated in the remote plasma source 126 is supplied to the processing chamber 102. One possible reason to use a remote plasma generator is to reduce or eliminate the ion bombardment of surfaces within the processing chamber 102, which is typically undesired. For instance, in a non-exclusive embodiment, the remote plasma source 126 may be used for cleaning the processing chamber 102, which tends to increase the longevity of various surfaces and/or components within the processing chamber 102 by reducing their exposure ion bombardment, which typically accelerates degradation.

In alternative embodiments, the pedestal 120 is either a Coulombic and Johnsen-Rahbek ("J-R") type ESC.

In yet other embodiments, the pedestal 120 may be made of a number of thermally conductive materials. Such materials may include, but are not limited to aluminum nitride, aluminum oxide, ceramic, other thermally conductive materials, or any combination thereof.

The tool 100 can be one of several different types of Chemical Vapor Deposition (CVD) tools, such as a Low Pressure CVD (LPCVD), Ultra High Vacuum CVS (UHVCVD), a Plasma Enhanced CVD (PECVD), a Remote Plasma Enhanced CVD (RPECVD) or an Atomic Layer Deposition (ALDCVD). As each of these tools is well known, a detailed explanation is not provided herein for the sake of brevity. However, regardless of the type of CVD tool, the substrate 122 is typically exposed to one or more precursors, which react or decompose on the surface of the substrate 122, forming a desired deposition layer. By repeating this process multiple times, multiple layers can be formed on the surface of the substrate 122. It should be understood that this list of CVD tools provided herein is not exhaustive and should not be construed as limiting. On the contrary, the pedestal 120 as described herein may be used with any type of CVD tool or tool that is used to process a substrate.

Figure 2:
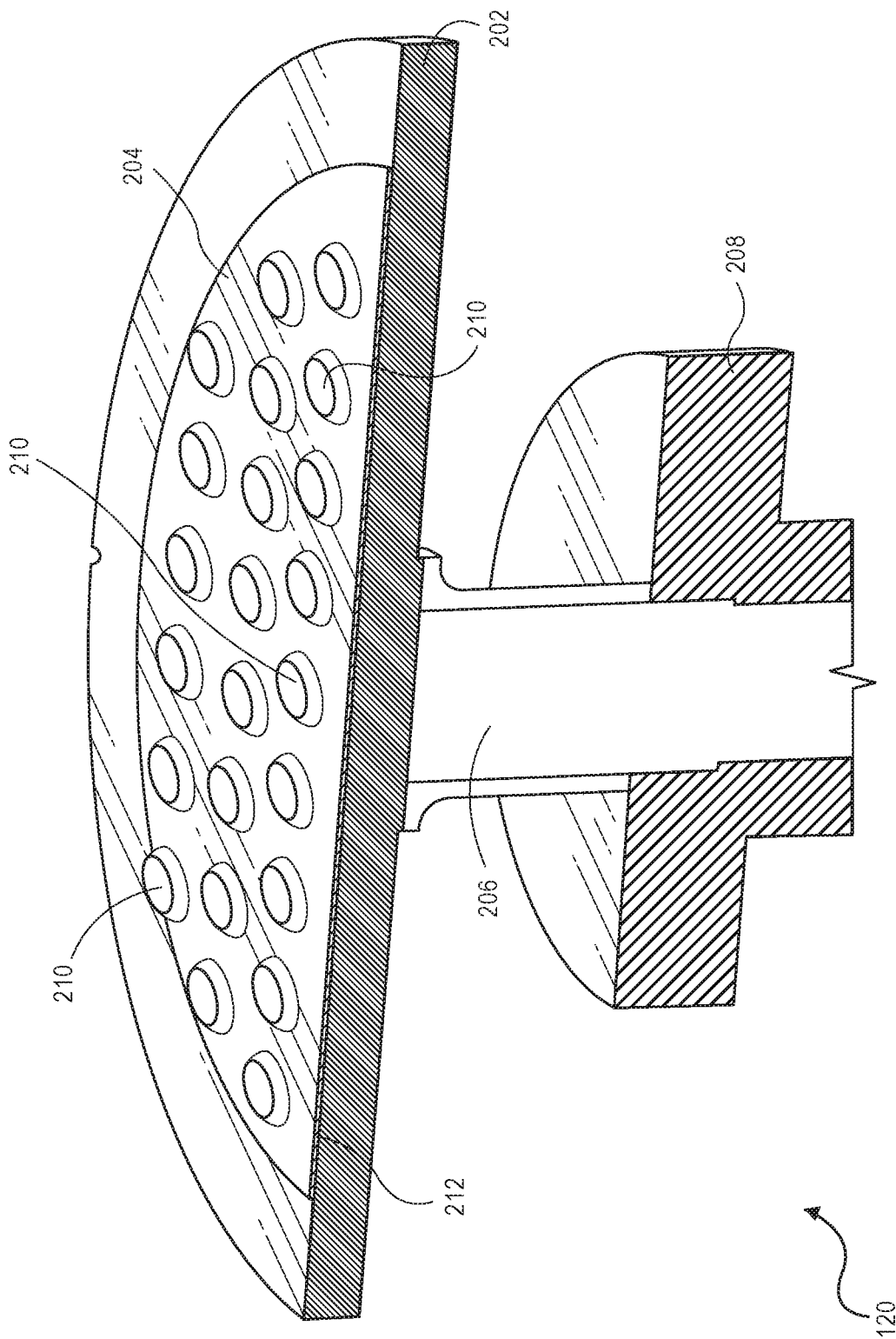
FIG. 2 is a perspective view of a cross-section of an electrostatic pedestal in accordance with a non-exclusive embodiment.

Referring to FIG. 2, a perspective, cross-sectional diagram of the ESC pedestal 120 is shown. The ESC pedestal 120 includes an ESC chuck 202 having a chucking surface 204 for chucking a substrate (not shown), a pedestal stem 206 that is arranged to support the ESC chuck 202 when mounted onto a recess provided in a pedestal mount 208.

The chucking surface 204 includes a plurality of raised Minimum Contact Areas (MCAs) 210. In a non-exclusive embodiment, the ESC chuck 202, chucking surface 204 and MCAs are made of aluminum nitride. At the operating temperatures (e.g., 400 to 650 degrees C.) commonly used in a CVD processing chamber, such as processing chamber 102, aluminum nitride has a finite resistance. As such, ESC pedestal 120 in this particular embodiment is a JR type ESC. In other embodiments, other materials may be used. With materials that are electric insulators, the ESC pedestal would be a Coulombic type ESC.

The MCAs 210 perform a number of functions. First, the MCAs 210 define the surface area in physical contact with the backside of the substrate 122 when chucked on surface 204. As a result, the charge transfer required to generate the clamping electrostatic force is concentrated in these locations. Second, the MCAs 210 reduce the amount of surface area of the backside of a substrate 122 in contact with the chucking surface 204. As a result, both metal contamination and current leakage is reduced.

In one particular embodiment, the MCAs 210 are round in shape, have a height of approximately 1 mill (0.001 of an inch), a diameter of approximately 0.028 of an inch (0.7112 millimeters) and a pitch of 0.015 inches (3.81 millimeters). It should be pointed out that FIG. 2 is not drawn to scale. For the sake of clarity, the MCAs 210 as shown are significantly larger relative to the chucking surface 204. In actual embodiments, the MCAs 210 would typically be smaller than illustrated.

The FIG. 2 embodiment is merely exemplary and should not be construed as limiting. In various other embodiments, the MCAs 210 may assume various shapes (e.g., square, rectangular, oval, polygon, etc.), may have a height taller or shorter, may vary in dimensions and pitch, and may cover a larger or smaller percentage of the chucking surface 204. In addition, the MCAs 210 may be arranged in a wide variety of arrangements (e.g., rows, columns, a specific pattern, etc.) on the chucking surface 204. In actual embodiments, the shape, height, pitch, surface area and pattern on the chucking surface 204 may widely vary and is at least partially dictated by a number of design constraints, such as the size of the substrate 122, the amount of clamping force needed, the type of tool 100, and a host of other engineering considerations.

The MCAs 210 and the substrate 122, such as a silicon wafer, are typically made of different materials. As a result, MCAs 210 and the backside of the substrate 122 will typically expand/contract at different rates with temperature changes incurred during clamping within the processing chamber 102. The different expansion/contraction rates create shear lateral forces across the top surfaces of the MCAs 210. Over time, these forces have been known to degrade the MCAs 210, changing surface roughness, reducing height, and altering their electrical properties, all of which tend to degrade the degree of electrostatic force generated at the chucking surface 204.

Conventional practice dictates that no material be deposited on the chucking surface 204 and/or MCAs 210 of an ESC 120. If such a material is present, charge traps will normally occur at or near the chucking surface, adversely affecting its electrical properties and interfering with the electrostatic charge clamping effect. Therefore, as a general rule, no material or coating is typically applied to or otherwise provided on the clamping surface with conventional ESCs.

Contrary to conventional practice, the Applicant proposes of silicon oxide ($SiO_2$) or silicon nitride ($Si_3N_4$) as a coating on the chucking surface 204 of the ESC 120. Electrons in both silicon oxide and silicon nitride become more excited at elevated temperatures. As a result, either of these materials (or a combination of both) becomes more conductive, and tends to act more like dielectric with finite resistance, at elevated temperatures in the range of 450 to 600 degrees C. Since this temperature range is often used in certain processing chamber of substrate processing tools, such as CVD tools, the Applicant has discovered that silicon oxide and/or silicon nitride can in fact be advantageously used on the chucking surface of an ESC.

The use of silicon oxide and silicon nitride formed on the chucking surface 204, including the MCAs 210, has a number of advantages:

(1) The coating can be used to protect the MCAs 210 from degradation and wear due to the shear lateral forces caused by different rates of thermal expansion of substrates 122 as noted above;

(2) The coating of silicon oxide and silicon nitride can be readily deposited and removed on the chucking surface 204 and/or MCAs 210 in situ the processing chamber 102. As a result, an old worn coating can be removed and replaced with a new coating as needed or at fixed intervals, all inside the processing chamber 102; and (3) Furthermore, the particle performance of processing chamber 102 can be improved by applying a coating onto the surfaces of the pedestal 120 and processing chamber 102. This coating adheres particles to theses surfaces of, reducing the likelihood of particle contamination on the substrate 122. The coating additionally provides a protective layer for any metal contamination on the chucking surface 204 of the pedestal 120, thereby minimizing metal contamination being transferred onto the substrates.

Figure 3:
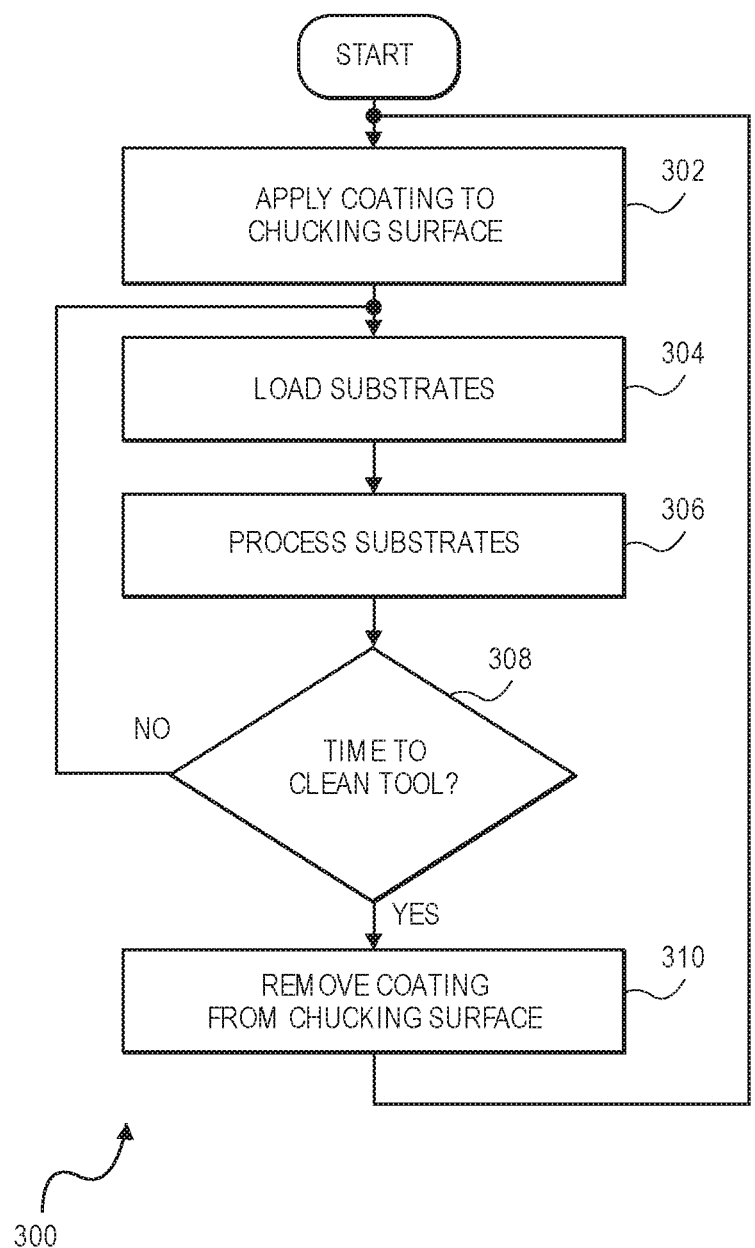
FIG. 3 a flow diagram illustrating steps for periodically applying in situ a coating to the chucking surface of an ESC within a processing chamber in accordance with a non-exclusive embodiment.

Referring to FIG. 3, a flow diagram 300 illustrating steps for periodically applying a coating to the chucking surface 204 of an ESC 120 in situ a processing chamber 102 is shown.

In the initial step 302, a coating of either silicon oxide or silicon nitride (or a combination of the two) is formed at least partially, including on the MCAs 210, of the chucking surface 204 of an ESC chuck 202. The coating is formed by introducing a silicon precursor and a reactant into the processing chamber 102. A chemical vapor deposition (CVD) plasma is then generated while the silicon precursor and the reactant are in the processing chamber. As a result, a coating is deposited or formed on the chucking surface 204.

In one embodiment, the coating is formed across the entire chucking surface 204, including the MCAs 210. In other embodiments, portions of the chucking surface 204 can be masked and the mask later removed after the coating is formed. As a result, the coating is provided only on the non-masked portions of the chucking surface 204.

In various embodiments, the silicon precursor or silicon source is selected from the group including (a) silane, (b) Tetraethyl Orthosilicate (TEOS), or a combination of both (a) and (b). The reactant is selected from the group including (a) oxygen ($O_2$), (b) nitrous oxide ($N_2O$), (c) ammonia ($NH3$), (d) nitrogen ($N2$) or any combination of (a) through (c). Once the precursor and the reactant are present in the processing chamber 102, the coating can be deposited during a CVD process.

The material make-up of the coating depends on the type of reactant used. With either silane or TEOS as a precursor, a silicon coating is grown or deposited on the chucking surface 204. If the reactant is an oxidizer, such as either oxygen or nitrous oxide, then the silicon coating is oxidized, resulting in silicon oxide. On the other hand if the reactant is ammonia or nitrogen, then silicon nitride results.

If both ammonia and oxygen and/or nitrous oxide is used as the reactant, then the resulting coating is a mix of both Silicon oxide and Silicon nitride.

Alternatively, by using one reactant initially and then later the other reactant, a multi-layered coating can be formed. For instance, by initially using oxygen and/or nitrous oxide and later ammonia, a multi-layered coating is formed with silicon oxide on the bottom and silicon nitride on the top. By swapping the sequence of the reactants, a complementary multi-layered structure can be created.

In step 304, substrates 122 are loaded into substrate processing tool 100 once the coating of desired material and thickness is formed in prior steps.

In step 306, the substrates 122 are processed in the processing chamber 102. The processing generally involves chucking a substrate 122 onto the chucking surface 204 of the ESC 120 and maintaining a temperature within the processing chamber within a predetermined range. As noted above, this range may be 400 to 650 degrees C. in one embodiment. In other embodiments, other ranges with higher or lower temperatures may be used. Once chucked, the substrate 122 is processed within the processing chamber 102. As noted above, the processing may involve thin film layer deposition, etching, photo-resist striping, substrate cleaning as well as lithography, ion implantation, etc.

In step 308, a decision is made if the processing chamber 102 needs to be cleaned or not. A number of factors may be used in making this decision. The decision can be based on an accumulated amount of processes conducted within the processing chamber 102 over a period of time. If the tool 102 is a CVD tool for instance, then cleaning intervals may be determined based on a specified amount of deposition material having been deposited on substrates 122 since the prior cleaning. Other decision factors may include time (e.g., the tool is cleaned at a periodic fixed interval) or after a predetermined number of substrates 122 have been processed, or any combination of these or other factors. If a decision is made to not clean the processing chamber 102, then steps 304 and/or 306 are repeated.

If a decision is made that it is time to clean the processing chamber 102, then a cleaning operation within the processing chamber 102, including the chucking surface 204, is performed as provided in step 310. The cleaning process generally involves using a halogen-based cleaning agent to remove the coating formed on a chucking surface 204 of the ESC 120 in situ within the processing chamber 102. A halogen-based cleaning agent, such as fluorine, nitrogen trifluoride or other fluorine contains gases, is introduced into the processing chamber 102. A plasma is then generated, which removes or etches away the coating on the chucking surface 204 and MCAs 210 along with other exposed surfaces, as is well known in the art.

Once the coating is removed, a new coating is formed on the chucking surface 204 and MCAs 210 as provided above in steps 302. Thereafter, steps 304 through 310 can be repeated over and over. With each cycle, an old, worn coating is removed in step 310 and a new, fresh coating is applied in step 302.

In yet another embodiment, the aforementioned cleaning and coating may be performed in situ the substrate processing tool during routine maintenance of the processing chamber 102. For instance, a halogen-based cleaning agent may be used from time-to-time to remove unwanted deposits and particles that have collected on surfaces inside the processing chamber 102 as a byproduct of substrate processing. Following the cleaning, a coating of silicon oxide and/or silicon nitride is then typically deposited to the clean surfaces within the processing chamber 102 in a subsequent plasma deposition step. Since the cleaning and recoating sequence for the chucking surface 204 of the pedestal 120 and the processing chamber 102 are essentially the same, both can be cleaned and recoated in situ the processing chamber 120 using the same cleaning and deposition sequence.

Figure 4A:
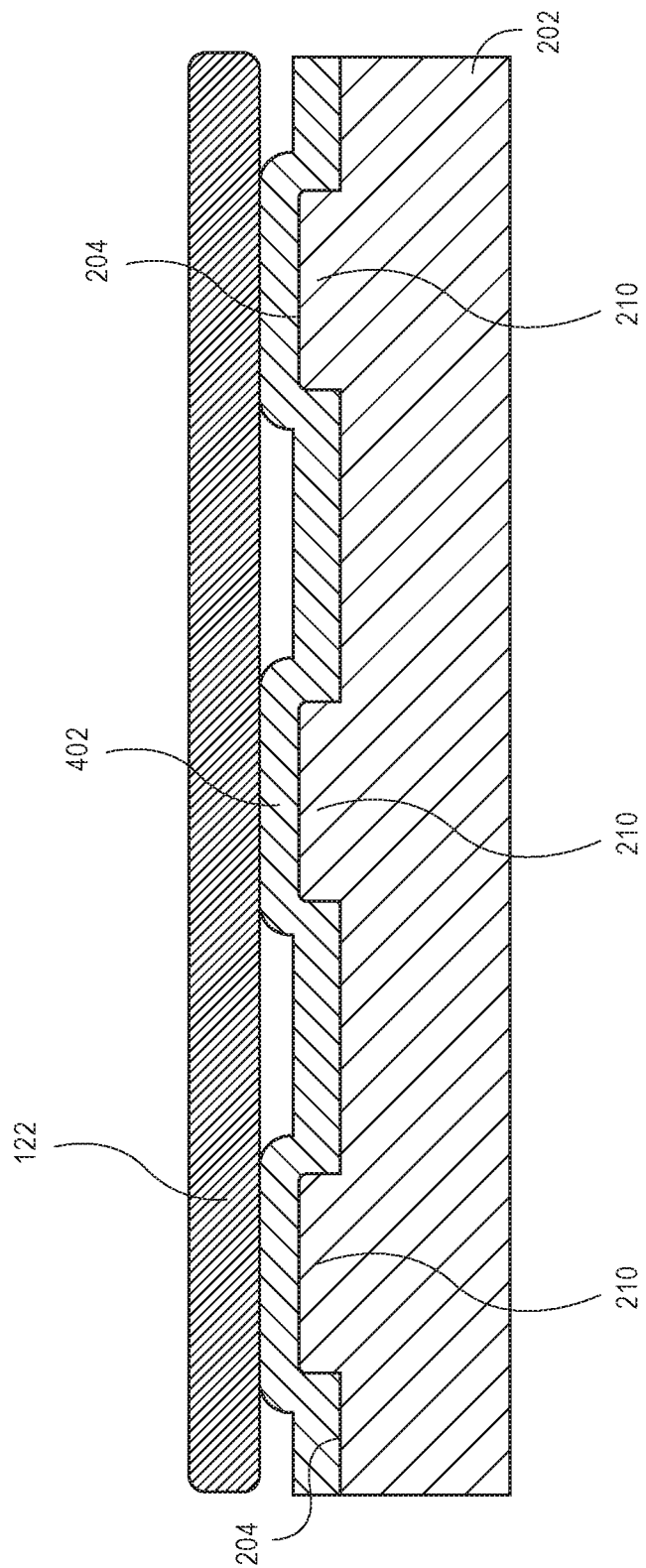
FIGS. 4A and 4B are enlarged, cross-sectional views of a substrate with different protective coatings in accordance with non-exclusive embodiments.

Referring to FIG. 4A, an enlarged, cross-sectional view of a substrate 122 on the chucking surface 204 of an ESC chuck 202 is shown. With this embodiment, a coating 402 is provided over and between the MCAs 210, covering the entire chucking surface 204. As previously noted, the coating 402 can be silicon oxide, silicon nitride or a combination of both.

Figure 4B:
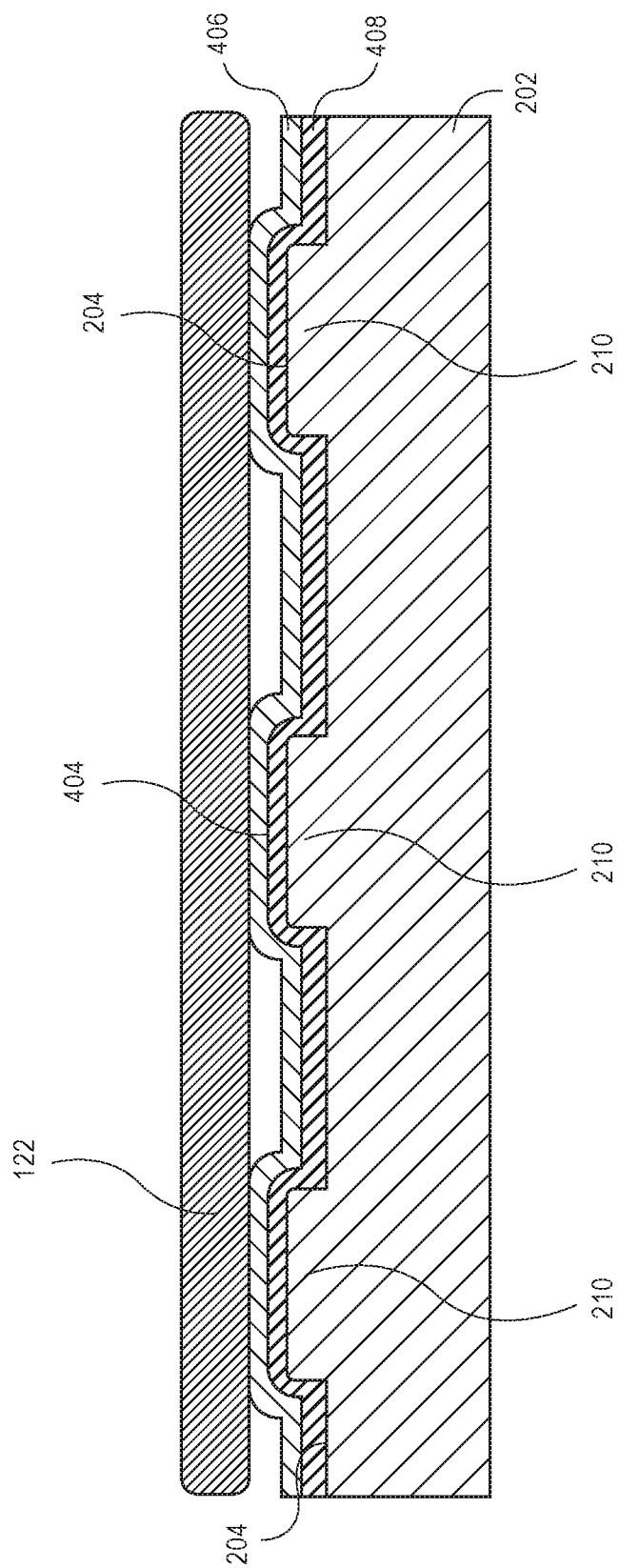

Referring to FIG. 4B, another enlarged, cross-sectional view of a substrate 122 on the chucking surface 204 of an ESC chuck 202 is shown. With this embodiment, multi-layer coating 404 is provided over and between the MCAs, including top layer 406 and bottom layer 408. As previously noted, the top layer 406 can be silicon oxide and the bottom layer 408 silicon nitride or vice-versa.

Although the two embodiments of FIG. 4A and FIG. 4B show the coating 402/404 over the entire chucking surface 204 including MCAs 210, these diagrams as depicted should not be limiting. On the contrary, the coatings 402/404 can be only partially formed on the chucking surface 204, for instance, just on the top of the MCAs 210.

In yet other embodiments, the coating, regardless of whether it is a single layer (e.g., FIG. 4A) or multi-layer (e.g., FIG. 4B), is approximately 2.5 microns thick. In alternative embodiments, the coating may range in thickness from 1.0 to 5.0 microns or from 50 nanometers to 30 microns. With thicker coatings, such as 1.0 or more, with conventional CVD tools, thicker coating in the 1.0 to 5.0 micron range are typically applied. With other tools such as Atomic Layer Deposition (ALDCVD) tools, extremely thin coating of approximately 50 nanometers can be applied.

With certain substrate processing tools 100 that include or operate in cooperation with a remote plasma source 126 (as shown in FIG. 1), the various plasma used to either form or remove the coating(s) 402/404, as described above with regard to steps 302 and 310, can be generated remotely in remote plasma source 126 and then supplied into the processing chamber 102 including the ESC 120. The above-described steps of removing old coating and replacing with a fresh coating is otherwise more less the same as described above.

Silicon oxide and silicon nitride (or a combination of both) can be used on the chucking surface 204, at elevated temperatures, without adversely affecting the electrostatic forces needed to clamp a substrate 122. While a specific range is noted above, it should be understood that these temperatures should not be construed as limiting. On the contrary, any temperature may apply, provided the electrical conductivity of the silicon oxide or silicon nitride is increased to the level where the at least a portion of the chucking surface 204 coated with the Silicon oxide or Silicon nitride generates a sufficient electrostatic force to clamp the substrate.

The coating 402/404 also helps improve substrate clamping by solving a number of issues that plaque conventional electrostatic substrate chucks. For instance, the presence of carbon on a chucking surface of an electrostatic chuck is known to possibly cause electrical shorting, which tends to reduce the electrostatic clamping force between the chucking surface and the substrate. The above-described coating process, however, tends to remove the presence of carbon from the chucking surface. As a result, the incidence of electrical shorting is significantly reduced. In addition, the presence of fluorine within a processing chamber is known to penetrate certain types of chucking surfaces, such as those made of ceramic, creating charge-traps. However, the Applicant has found that at the processing temperatures of 450 to 600 degrees C. as described herein, the incidence of charge-traps is reduced. As a result, the electrostatic clamping force is not adversely affected.

Figure 5:
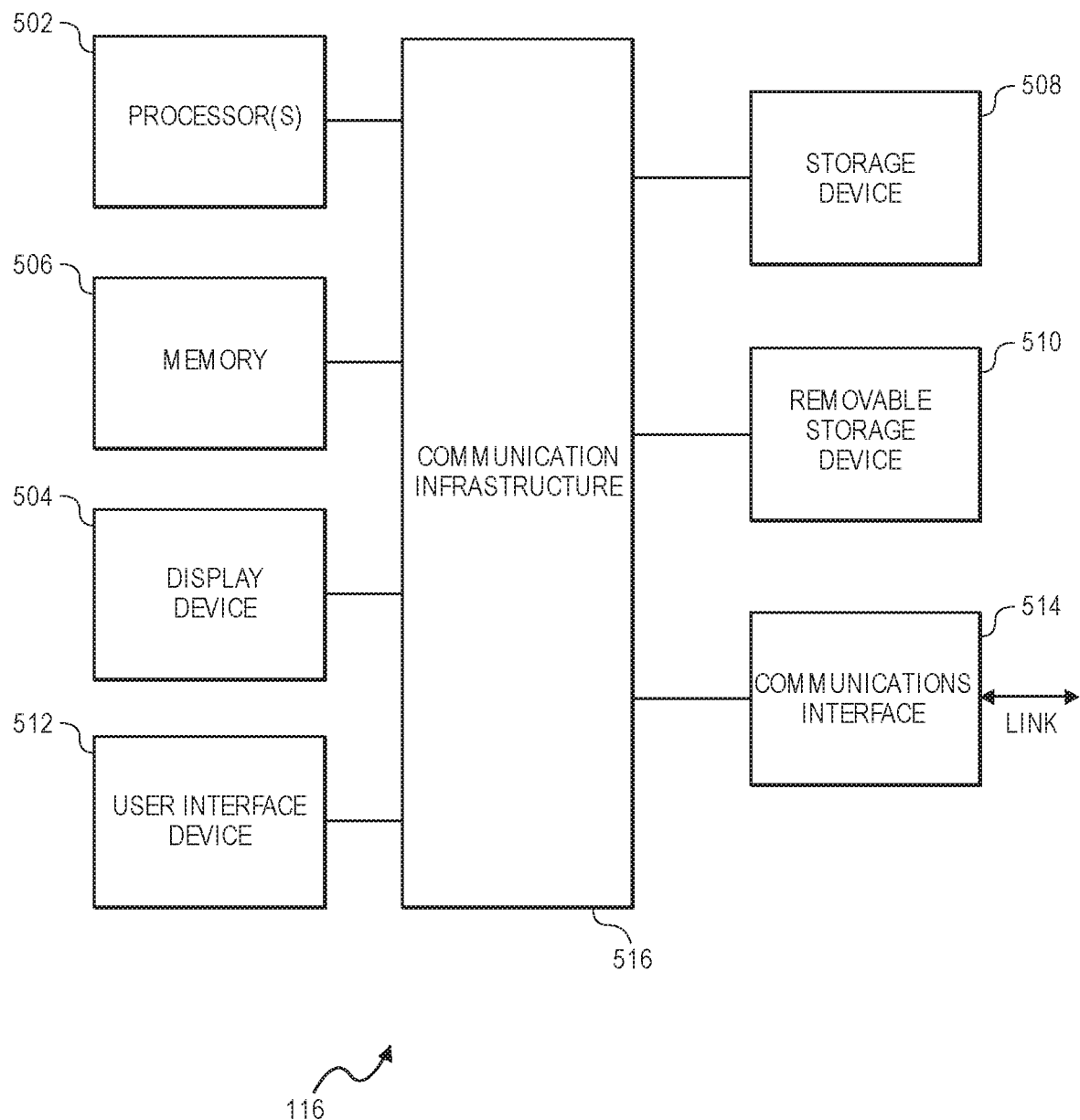
FIG. 5 is a block diagram of a computing system that may be configured as a controller for controlling the substrate fabrication tool in accordance with a non-exclusive embodiment.

Referring to FIG. 5, a block diagram of a computing system that may be configured as the controller 116 for controlling the substrate processing tool 100 in accordance with a non-exclusive embodiment is shown.

The controller 116 may have many physical forms ranging from a computer, server, a small handheld device up to a huge super computer. The controller 116 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the controller 116 and external devices via a link. The controller 116 may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

It should be understood that while the present application is described in the context of various deposition tools, by no means this be construed as limiting. On the contrary the ESC pedestal 120 as described herein may be used in a wide variety of substrate processing tools, including but not limited to, lithography tools, plasma etching or chemical etching tools, ion implantation tools, substrate cleaning tools, etc.

Although only a few embodiments have been described in detail, it should be appreciated that the present application may be implemented in many other forms without departing from the spirit or scope of the disclosure provided herein. For instance, the substrate can be a semiconductor wafer, a discrete semiconductor device, a flat panel display, or any other type of work piece.

Therefore, the present embodiments should be considered illustrative and not restrictive and is not to be limited to the details given herein, but may be modified within the scope and equivalents of the appended claims.

What is claimed is:

1. A method, comprising:
   (a) using a halogen-based cleaning agent to remove a first coating formed on an ElectroStatic Chuck (ESC) chucking surface of a pedestal in a processing chamber; and
   (b) depositing a second coating formed on the ESC chucking surface of the pedestal in situ the processing chamber, wherein depositing the second coating comprises:
      providing a plasma in the processing chamber, the plasma including a silicon precursor and a reactant; and
      exposing the surfaces within the processing chamber and the ESC chucking surface to the plasma, the exposing resulting in the formation of the second coating on the surfaces of the processing chamber and the ESC chucking surface.

2. The method of claim 1, further comprising repeating (a) and (b) so that the ESC chucking surface of the pedestal is refreshed each repeat with a new second coating.

3. The method of claim 2, repeating (a) and (b) and the initiation of each repeat is determined by when a specified amount of deposition material has been deposited on one or more substrates while chucked to the ESC chucking surface of the pedestal in the processing chamber.

4. The method of claim 3, wherein the processing chamber is a Chemical Vapor Processing chamber.

5. The method of claim 3, wherein the processing chamber is an Atomic Layer Deposition (ALD) chamber.

6. The method of claim 1, wherein the halogen-based cleaning agent is fluorine.

7. The method of claim 1, wherein the first coating and the second coating are each selected from a group including: silicon oxide, silicon nitride or a combination of both silicon oxide and silicon nitride.

8. The method of claim 1, wherein the second coating has a thickness ranging from 1.0 micron to 5.0 microns.

9. The method of claim 1, wherein the second coating has a thickness ranging from 50 nanometers to 30 microns.

10. The method of claim 1, wherein the ESC chucking surface of the pedestal is either a Coulombic type or a Johnsen-Rahbek type chucking surface.

11. The method of claim 1, wherein the second coating is multi-layered.

12. A substrate processing tool, comprising:
    a processing chamber;
    an ElectroStatic Chuck (ESC) pedestal, having an ESC chucking surface for chucking a substrate, arranged within the processing chamber;
    wherein the substrate processing tool is further arranged to implement a maintenance routine comprising:
    (a) cleaning deposits formed on surfaces within the processing chamber and the ESC chucking surface using a cleaning agent provided in the processing chamber; and
    (b) coating the surfaces within the processing chamber and the ESC chucking surface with either silicon oxide or silicon nitride following the cleaning, wherein coating the surfaces within the processing chamber and the ESC chucking surface further comprises:
       providing a plasma in the processing chamber, the plasma including a silicon precursor and a reactant; and
       exposing the surfaces within the processing chamber and the ESC chucking surface to the plasma, the exposing resulting in the formation of the coating on the surfaces of the processing chamber and the ESC chucking surface, and
    wherein the cleaning and the coating of the ESC chucking surface is performed in situ the processing chamber while the surfaces within the processing chamber are cleaned and coated respectively.

13. The substrate processing tool of claim 12, wherein the ESC is either a Coulombic type or a Johnsen-Rahbek (J-R) type ESC.

14. The substrate processing tool of claim 12, wherein the coating on the ESC chucking surface has a thickness ranging from 1.0 micron to 5.0 microns.

15. The substrate processing tool of claim 12, wherein the coating on the ESC chucking surface has a thickness ranging from 50 nanometers to 30 microns.

16. The substrate processing tool of claim 12, wherein the coating on the ESC chucking surface is multi-layered.

17. The substrate processing tool of claim 12, wherein the processing chamber is a Chemical Vapor Processing chamber.

18. The substrate processing tool of claim 12, wherein the processing chamber is an Atomic Layer Deposition (ALD) chamber.

19. The substrate processing tool of claim 12, wherein the cleaning agent is a halogen-based cleaning including fluorine.

20. The substrate processing tool of claim 12, wherein the plasma is provided by either:

generating the plasma remotely and supplying the plasma to the processing chamber; or generating the plasma within the processing chamber.

21. The substrate processing tool of claim 12, further arranged to periodically repeat (a) and (b) so that a new coating of either silicon oxide or silicon nitride is formed on the ESC chucking surface in situ the processing chamber following each repeat respectively.

\* \* \* \* \*